(12) United States Patent
Maeda

(10) Patent No.: US 8,946,906 B2
(45) Date of Patent: Feb. 3, 2015

(54) MULTILAYER WIRING SUBSTRATE AND METHOD OF MANUFACTURING THE SAME

(75) Inventor: Shinnosuke Maeda, Nagoya (JP)

(73) Assignee: NGK Spark Plug Co., Ltd., Nagoya (JP)

( * ) Notice: Subject to any disclaimer, the term of this patent is extended or adjusted under 35 U.S.C. 154(b) by 0 days.

(21) Appl. No.: 13/324,535

(22) Filed: Dec. 13, 2011

(65) Prior Publication Data

US 2012/0153463 A1 Jun. 21, 2012

(30) Foreign Application Priority Data

Dec. 16, 2010 (JP) ................................. 2010-280320
Nov. 1, 2011 (JP) ................................. 2011-240394

(51) Int. Cl.
*H01L 23/522* (2006.01)
*H05K 1/11* (2006.01)
(Continued)

(52) U.S. Cl.
CPC ............ *H01L 23/5226* (2013.01); *H05K 1/115* (2013.01); *H05K 3/0035* (2013.01); *H01L 23/49822* (2013.01); *H05K 3/4644* (2013.01); *H05L 3/4682* (2013.01); *H05K 2201/09845* (2013.01); *H05K 2201/09854* (2013.01); *H05K 2203/108* (2013.01); *H05K 2203/1476* (2013.01); *H01L 23/49827* (2013.01); *H01L 2224/16225* (2013.01); *H01L 2924/15311* (2013.01)
USPC ................... 257/774; 257/739; 257/E21.012; 257/E23.145; 438/640

(58) Field of Classification Search
USPC .................. 257/737–739, 773, 774, E23.067, 257/E23.145, E21.012, E21.578; 438/637–640, 964
See application file for complete search history.

(56) References Cited

U.S. PATENT DOCUMENTS 6,132,543 A * 10/2000 Mohri et al. ................ 156/89.12
6,316,738 B1 * 11/2001 Mori et al. ...................... 174/261
(Continued)

FOREIGN PATENT DOCUMENTS

CN    1620232 A1    5/2005
JP    2000-244127 A    9/2000
(Continued)

OTHER PUBLICATIONS

SIPO, First Office Action issued in corresponding Chinese application No. 201110378191.1, issued Mar. 27, 2014.
(Continued)

*Primary Examiner* — Thao X Le
*Assistant Examiner* — Gardner W Swan
(74) *Attorney, Agent, or Firm* — Stites & Harbison PLLC; Jeffrey A. Haeberlin; Nicolo Davidson

(57) ABSTRACT

To provide a multilayer wiring substrate in which the connection reliability of via conductors is enhanced, via holes are formed in a resin interlayer insulation layer which isolates a lower conductor layer from an upper conductor layer, and via conductors are formed in the via holes for connecting the lower conductor layer and the upper conductor layer. The surface of the resin interlayer insulation layer is a rough surface, and the via holes open at the rough surface of the resin interlayer insulation layer. Stepped portions are formed in opening verge regions around the via holes such that the stepped portions are recessed from peripheral regions around the opening verge regions. The stepped portions are higher in surface roughness than the peripheral regions.

15 Claims, 7 Drawing Sheets

(51) Int. Cl.
*H05K 3/00* (2006.01)
*H01L 23/498* (2006.01)
*H05K 3/46* (2006.01)

(56) References Cited

U.S. PATENT DOCUMENTS

| | | | |
|---|---|---|---|
| 6,674,017 B1 | 1/2004 | Yamasaki et al. | |
| 7,084,056 B2 * | 8/2006 | Won | 438/627 |
| 7,692,103 B2 | 4/2010 | Saiki et al. | |
| 7,807,567 B2 * | 10/2010 | Kawano et al. | 438/640 |
| 8,263,878 B2 | 9/2012 | Takenaka et al. | |
| 2005/0001318 A1 | 1/2005 | Won | |
| 2005/0103520 A1 | 5/2005 | Saiki et al. | |
| 2009/0029506 A1 * | 1/2009 | Fujii et al. | 438/127 |
| 2009/0242261 A1 | 10/2009 | Takenaka et al. | |
| 2010/0084175 A1 | 4/2010 | Suzuki et al. | |
| 2011/0000706 A1 * | 1/2011 | Shomura et al. | 174/262 |

FOREIGN PATENT DOCUMENTS

| | | |
|---|---|---|
| JP | 2005-033231 A | 2/2005 |
| JP | 2008-270768 A | 11/2008 |
| TW | 201026178 A1 | 7/2010 |
| WO | 2009/119680 A1 | 10/2009 |

OTHER PUBLICATIONS

Taiwan Patent Office, Notification for the Opinion of Examination issued in corresponding Taiwanese application No. 100146490, mailed Aug. 26, 2014.

* cited by examiner

MULTILAYER WIRING SUBSTRATE AND METHOD OF MANUFACTURING THE SAME

CROSS REFERENCE TO RELATED APPLICATIONS

The present application claims priority from Japanese Patent Application No. 2010-280320, which was filed on Dec. 16, 2010, and Japanese Patent Application No. 2011-240394, which was filed on Nov. 1, 2011, the disclosures of which are herein incorporated by reference in their entirety.

BACKGROUND OF THE INVENTION

1. Field of the Invention

The present invention relates to a multilayer wiring substrate in which via holes are formed in interlayer insulation layers each isolating a lower conductor layer from an upper conductor layer, and via conductors are formed in the respective via holes for connecting the lower conductor layer and the upper conductor layer, as well as to a method of manufacturing the multilayer wiring substrate.

2. Description of Related Art

In recent years, in association with a size reduction in electrical equipment, electronic equipment, etc., a reduction in size, and densification are required of multilayer wiring substrates to be mounted on such equipment. Practicalized multilayer wiring substrates are manufactured by a so-called build-up process in which resin interlayer insulation layers and conductor layers are alternatingly laminated together (refer to Patent Documents 1 to 3). In the multilayer wiring substrates, a lower conductor layer formed on the lower surface of a resin interlayer insulation layer and an upper conductor layer formed on the upper surface of the resin interlayer insulation layer are connected through via conductors formed in the resin interlayer insulation layer.

In manufacture of the above-mentioned multilayer wiring substrates, via holes are formed in each resin interlayer insulation layer by means of laser machining; the upper surface of the resin interlayer insulation layer is subjected to electroless copper plating, copper electroplating, etc.; and unnecessary portions of the plating are etched away. As a result, an upper conductor layer is formed in a desired pattern on the upper surface of the resin interlayer insulation layer, and via conductors for connecting the upper conductor layer and a lower conductor layer are formed in the respective via holes. The surface of the resin interlayer insulation layer is roughened to become a rough surface, thereby ensuring adhesion between the surface and a conductor layer.

Other than the above-mentioned laser machining method, a practicalized method of forming via holes uses a publicly known technique of lithography and is composed of an exposure step, a development step, etc., (refer to, for example, Patent Documents 2 and 3).

Lands greater in diameter than the via holes are formed on respective upper ends of the via conductors which partially constitute the upper surface of the resin interlayer insulation layer. The via conductors are connected to respective patterned wiring lines of the conductor layer through the lands.

Meanwhile, when the surface roughness of a resin interlayer insulation layer 101 (see FIG. 17) increases, in a copper plating process for forming patterned wiring lines 102 (a conductor layer), copper which is plated for forming the patterned wiring lines 102 is deposited in pits 103 on the surface of the resin interlayer insulation layer 101, and copper 102a deposited in the pits 103 is in such a condition as to project outward from a specified range of a wiring line width W1 (see FIG. 17). In this case, such a condition is an obstacle to high-density disposition of the patterned wiring lines 102. Thus, in recent multilayer wiring substrates, the surface roughness of the resin interlayer insulation layer 101 is decreased from conventional degrees of roughness, thereby implementing high-density disposition of the patterned wiring lines 102.

RELATED ART DOCUMENTS

Patent Documents

Patent Document 1 is Japanese Patent Application Laid-Open (kokai) No. 2008-270768. Patent Document 2 is Japanese Patent Application Laid-Open (kokai) No. 2005-33231. Patent Document 3 is Japanese Patent Application Laid-Open (kokai) No. 2000-244127.

BRIEF SUMMARY OF THE INVENTION

However, when the surface roughness of the resin interlayer insulation layer 101 is decreased, the bonding strength between the resin interlayer insulation layer 101 and the patterned wiring lines 102 deteriorates. Also, a relatively large stress is imposed on connection portions between the patterned wiring lines 102 and the via conductors (connection portions of lands). Thus, delamination is apt to occur starting from the connections between the patterned wiring lines 102 and the via conductors.

The present invention has been conceived in view of the above problem, and an object of the invention is to provide a multilayer wiring substrate in which delamination at via conductors is restrained, thereby enhancing the connection reliability of the via conductors. Another object of the present invention is to provide a manufacturing method suitable for manufacture of the multilayer wiring substrate.

A means (means 1) for solving the above problem is a multilayer wiring substrate in which via holes are formed in an interlayer insulation layer isolating a lower conductor layer from an upper conductor layer, and via conductors are formed in the respective via holes for connecting the lower conductor layer and the upper conductor layer. A surface of the interlayer insulation layer is a rough surface. The via holes open at the rough surface of the interlayer insulation layer. Stepped portions are formed in opening verge (edge, rim, margin, or boundary) regions of the surface around the via holes such that the stepped portions are recessed (depressed) from peripheral regions around the opening verge areas (regions); and the stepped portions are higher in surface roughness than the peripheral regions.

Thus, according to the invention described in means 1, in the interlayer insulation layer, the stepped portions are formed in the opening verge regions around the via holes. By virtue of this feature, as compared with the case where no stepped portions are provided in opening verge regions around the via holes, concentration of stress on the vicinities of the opening verges of the via holes is avoided, and adhesion can be ensured between the upper conductor layer and the interlayer insulation layer. Furthermore, since the stepped portions are higher in surface roughness than their peripheral regions, the bonding strength between the upper conductor layer and the interlayer insulation layer can be enhanced sufficiently at the stepped portions. As a result, delamination at connections between the via conductors and the upper conductor layer can be restrained, whereby the connection reliability of the via conductors can be improved.

Preferably, the upper conductor layer assumes the form of lands connected to upper ends of the corresponding via conductors, and maximum diameters of the lands are equal to or greater than those of the corresponding stepped portions. By virtue of this feature, in the interlayer insulation layer, the surfaces of the stepped portions having high surface roughness are reliably covered with the corresponding lands; thus, patterned wiring lines can be formed at a fine pitch. Preferably, a thickness (thicknesses) of portions of the upper conductor layer formed on the stepped portions of the interlayer insulation layer is (are) greater than a thickness (thicknesses) of portions of the upper conductor layer formed on the peripheral regions of the interlayer insulation layer. Since the thickness of the interlayer wiring is increased at the connections between the via conductors and the interlayer wiring, from which delamination is apt to start, delamination can be prevented.

Preferably, the via holes, the stepped portions, and the lands are disposed concentrically. By virtue of this feature, the stepped portions can be formed relatively easily around the via holes. Also, preferably, the stepped portions have a depth of 1 μm to 3 μm inclusive and a surface roughness of less than 1 μm.

Preferably, the stepped portions have a width of 10 μm to 30 μm inclusive. By virtue of this feature, the stepped portions can be smaller in maximum diameter than the lands.

Preferably, the interlayer insulation layer is formed by use of a buildup material which is formed of an insulation resin material containing an inorganic filler in an amount of 50% by weight or greater. By means of increasing the inorganic filler content in this manner, the surface roughness of the interlayer insulation layer can be restrained, whereby wiring lines of the conductor layer can be formed at a fine pitch on the interlayer insulation layer.

Preferably, the via conductors are filled vias formed through copper plating. The via conductors may be conformal vias; however, the via conductors in the form of filled vias can be reduced in resistance. The conformal via is a via of such a type that a plating layer of a uniform thickness is formed along the wall of the via hole; thus, the via hole is not completely filled with the plating layer, and the via has a depression. By contrast, the filled via is a via of such a type that the thickness of the plating layer is not uniform, and the via hole is completely filled with the plating layer, so that the via does not have a depression.

Material for the interlayer insulation layers of the multilayer wiring substrate can be selected as appropriate in consideration of insulating performance, heat resistance, humidity resistance, etc. Preferred examples of a material used to form the interlayer insulation layers include thermosetting resins, such as epoxy resin, phenolic resin, urethane resin, silicone resin, and polyimide resin; and thermoplastic resins, such as polycarbonate resin, acrylic resin, polyacetal resin, and polypropylene resin. Also, examples of an inorganic filler contained in the interlayer insulation layer include fillers of inorganic oxides, such as silica, titania, and alumina. Particularly, a silica filler is low in dielectric constant and in coefficient of linear expansion; thus, through addition of a silica filler to the interlayer insulation layer, the quality of the multilayer wiring substrate can be further enhanced.

Another means (means 2) for solving the above problem is a multilayer wiring substrate which comprises an interlayer insulation layer; via conductors charged into via holes formed in the interlayer insulation layer; terminal pads embedded in the interlayer insulation layer; and an interlayer wiring formed on a surface of the interlayer insulation layer and connected to the terminal pads via the via conductors, wherein the via holes are shaped such that their diameters increase from the terminal pad side toward the interlayer wiring side, and stepped portions are formed in respective opening verge regions of the surface of the interlayer insulation layer around the via holes such that the stepped portions are recessed (depressed) from peripheral regions around the opening verge regions.

The terminal pads receive influences from another wiring substrate or a component connected to the terminal pads, whereby stress concentrates at the terminal pads. Also, a relatively large stress acts on via conductors connected directly to the terminal pads. Therefore, delamination is apt to occur starting from the connections between the via conductors and the interlayer wiring connected directly to the via conductors. In the wiring substrate of the above-described mode, stepped portions are formed in opening verge regions around the via holes such that the stepped portions are depressed from peripheral regions around the opening verge regions. Such stepped portions can disperse the stress acting on the connections between the via conductors and the interlayer wiring, to thereby restrain delamination.

Preferably, the interlayer wiring is formed on the stepped portions and the peripheral regions, and other via conductors are connected to portions of the interlayer wiring formed on the peripheral regions. Preferably, a thickness of portions of the interlayer wiring formed on the stepped portions of the interlayer insulation layer is greater than a thickness of portions of the interlayer wiring formed on the peripheral regions of the interlayer insulation layer. Since the thickness of the interlayer wiring is increased at the connections between the via conductors and the interlayer wiring, from which delamination is apt to start, delamination can be prevented.

Preferably, the interlayer wiring includes lands connected to the ends of the via conductors, and the maximum diameters of the lands are equal to or greater than those of the corresponding stepped portions. By virtue of this feature, in the interlayer wiring, the stepped portions are reliably covered with the corresponding lands; thus, delamination can be prevented without fail.

The connection pads may be pads which are connected to a semiconductor chip via solder bumps. Since the semiconductor chip differs in coefficient of thermal expansion from the wiring substrate, stress is apt to concentration at connections between the semiconductor chip and the wiring substrate. However, in the case where the wiring substrate of the above-described mode is employed, the stress acting on the connections between the connection pads for the semiconductor chip and the interlayer wiring can be dispersed, whereby delamination can be restrained.

Another means (means 3) for solving the above problem is a method of manufacturing the multilayer wiring substrate described in means 1, comprising an interlayer insulation layer forming step of forming the interlayer insulation layer which covers the lower conductor layer; a laser irradiation step of irradiating predetermined via hole formation positions of the interlayer insulation layer with a laser beam having a first laser energy, and irradiating predetermined stepped portion formation positions of the interlayer insulation layer with a laser beam having a second laser energy weaker than the first laser energy; and a roughening step of roughening, after the laser irradiation step, the interlayer insulation layer so as to make an entire surface of the interlayer insulation layer a rough surface and to form the stepped portions at the predetermined stepped portion formation positions and to make surfaces of the stepped portions rough surfaces.

According to the invention described in means 2, through laser irradiation, vias are formed in the interlayer insulation layer, and the interlayer insulation layer is eroded at the predetermined stepped portion formation positions; i.e., at the opening verges of the via holes. Then, the roughening step forms the stepped portions and roughens the surfaces of the stepped portions. By virtue of these steps, the stepped portions can be reliably formed in opening verge regions around the via holes, and the bonding strength between the upper conductor layer and the interlayer insulation layer can be sufficiently enhanced.

Preferably, the roughening step is a desmear step which uses an etchant. In this case, in addition to the roughening of the entire surface of the interlayer insulation layer and the roughening of the surfaces of the stepped portions, smear which remains in the via holes after laser irradiation can be reliably removed. The roughening step may use solid or gas other than liquid for roughening.

BRIEF DESCRIPTION OF THE DRAWINGS

Illustrative aspects of the invention will be described in detail with reference to the following figures wherein.

DETAILED DESCRIPTION OF EXEMPLARY EMBODIMENTS OF THE INVENTION

First Embodiment

A multilayer wiring substrate according to a first embodiment of the present invention will next be described in detail with reference to the drawings.

Figure 1:
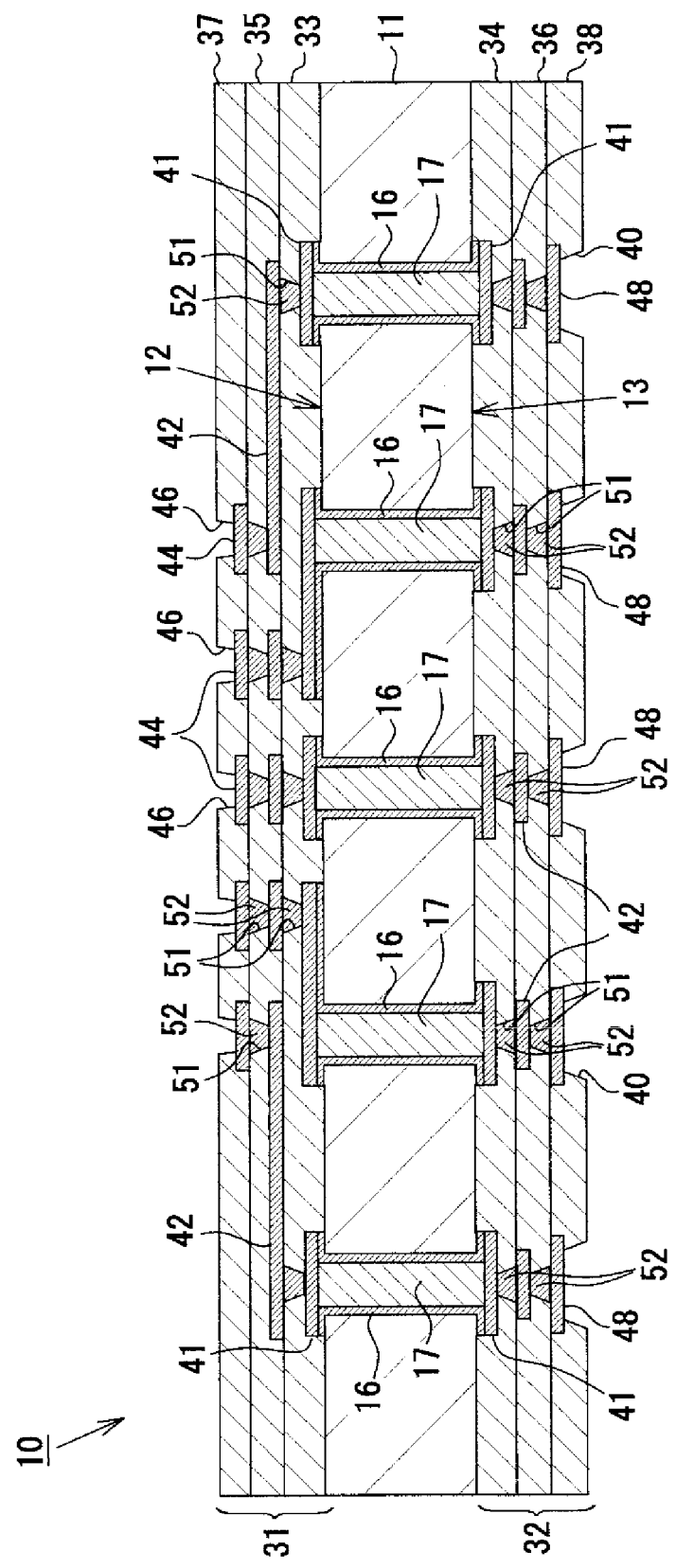
FIG. 1 is a schematic sectional view showing a multilayer wiring substrate according to a first embodiment of the present invention.

As shown in FIG. 1, a multilayer wiring substrate 10 of the present embodiment includes a core substrate 11 resembling a substantially square plate; a first buildup layer 31 formed on a core main surface 12 of the core substrate 11; and a second buildup layer 32 formed on a core back surface 13.

The core substrate 11 of the present embodiment is a plate having a substantially square shape as viewed in plane and measures 25 mm length×25 mm width×0.9 mm thickness. The core substrate 11 is formed of, for example, a resin insulation material (a glass epoxy material) in which glass cloth serving as a reinforcement material is impregnated with epoxy resin. The core substrate 11 has a plurality of through hole conductors 16 extending therethrough between the core main surface 12 and the core back surface 13. The interiors of the through hole conductors 16 are filled with respective blocking bodies 17; for example, epoxy resin. Conductor layers 41 made of copper are formed through patterning on the core main surface 12 and the core back surface 13, respectively, of the core substrate 11. The conductor layers 41 are electrically connected to the through hole conductors 16.

The first buildup layer 31 formed on the core main surface 12 of the core substrate 11 has a structure in which two resin interlayer insulation layers 33 and 35 made of a thermosetting resin (epoxy resin) and a conductor layer 42 made of copper are laminated alternatingly. Terminal pads 44 are formed in an array at a plurality of positions on the surface of the second resin interlayer insulation layer 35. A substantially entire surface of the resin interlayer insulation layer 35 is covered with a solder resist layer 37. The solder resist layer 37 has openings 46 formed at predetermined positions for exposing the terminal pads 44 therethrough. The resin interlayer insulation layers 33 and 35 have via holes 51 formed therein at a plurality of positions and filled via conductors 52 formed in the respective via holes 51. The via conductors 52 are electrically connected to the conductor layers 41 and 42 and to the terminal pads 44.

The second buildup layer 32 formed on the core back surface 13 of the core substrate 11 has substantially the same structure as that of the above-mentioned first buildup layer 31. Specifically, the second buildup layer 32 has a structure in which two resin interlayer insulation layers 34 and 36 and the conductor layer 42 are laminated alternatingly. The resin interlayer insulation layers 34 and 36 also have the via holes 51 formed therein at a plurality of positions and the via conductors 52 formed in the respective via holes 51. The via conductors 52 are electrically connected to the conductor layers 41 and 42. BGA pads 48 are formed in an array on the lower surface of the resin interlayer insulation layer 36 at positions of the lower ends of the via conductors 52 and are electrically connected to the conductor layer 42 through the via conductors 52. Furthermore, a substantially entire lower surface of the resin interlayer insulation layer 36 is covered with a solder resist layer 38. The solder resist layer 38 has openings 40 formed at predetermined positions for exposing the BGA pads 48 therethrough.

In the multilayer wiring substrate 10 of the present embodiment, the resin interlayer insulation layers 33 to 36 of the buildup layers 31 and 32 are formed by use of a buildup material in which a thermosetting insulation resin material (specifically, epoxy resin) contains an inorganic filler (specifically, silica filler) in an amount of 60% by weight. The surfaces of the resin interlayer insulation layers 33 to 36 are rough surfaces, and the via holes 51 open at the rough surfaces of the resin interlayer insulation layers 33 to 36. In the multilayer wiring substrate 10, by means of the surfaces of the resin interlayer insulation layers 33 to 36 being rough surfaces, adhesion of the conductor layers 42 and the pads 44 and 48 to the corresponding resin interlayer insulation layers 33 to 36 is ensured.

Figure 2:
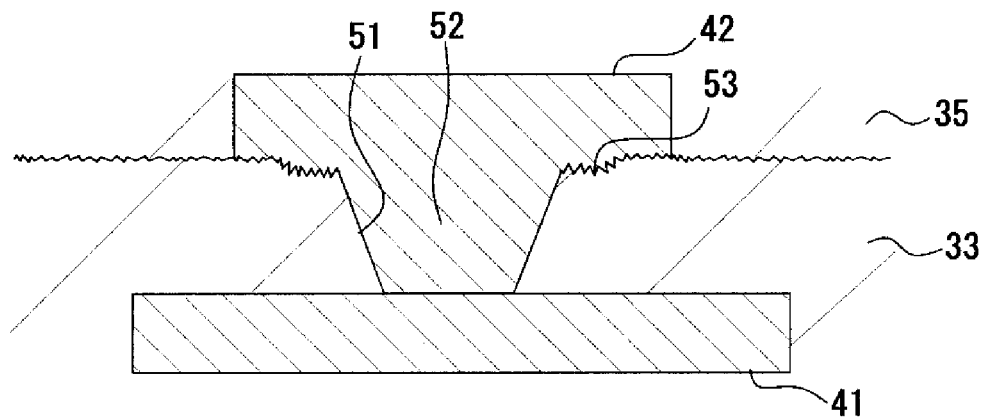
FIG. 2 is an enlarged sectional view showing a via hole and a via conductor.
Figure 3:
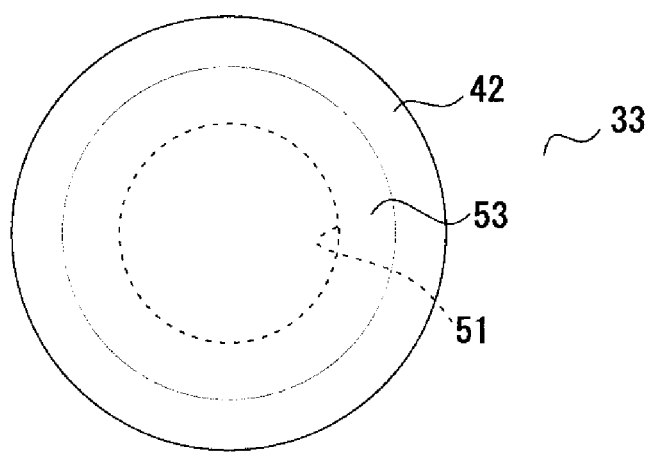
FIG. 3 is a plan view showing the via hole and a land.

As shown in FIG. 2, a stepped portion 53 is formed around the verge of opening of each via hole 51 such that the stepped portion 53 is depressed from its peripheral region, and the stepped portion 53 is higher in surface roughness than the peripheral region therearound. FIG. 2, shows the via hole 51 and the via conductor 52 formed in the resin interlayer insulation layer 33, and the via conductor 52 connects the conductor layer 41 on the lower side (the lower conductor layer) and the conductor layer 42 on the upper side (the upper conductor layer). The conductor layer 42 shown in FIG. 2 constitutes a land connected to the upper end of the via conductor 52. As shown in FIG. 3, the land of the conductor layer 42, the via hole 51, and the stepped portion 53 are disposed concentrically. FIG. 3 is a plan view of the conductor layer 42 (land) as viewed from above the resin interlayer insulation layer 33 in a condition in which the resin interlayer insulation layer 35 and the solder resist layer 37 are removed.

In the present embodiment, the stepped portions 53 have a depth of about 2 μm and a surface roughness of less than 1 μm. Also, the stepped portions 53 have a width of about 20 μm. The surface roughness was measured in accordance with JIS B 0601: 2001. As shown in FIGS. 2 and 3, in the present embodiment, the maximum diameter of the conductor layer 42 (land) connected to the upper end of the via conductor 52 is greater than that of the stepped portion 53. That is, the stepped portion 53 is covered completely with the conductor layer 42.

Next, a method of manufacturing the multilayer wiring substrate 10 of the present embodiment will be described.

First, there is prepared a copper clad laminate in which copper foil is affixed on opposite sides of a base material. By use of a drilling machine, through holes (not shown) are formed beforehand in the copper clad laminate in such a manner as to extend through the laminate between the front and back surfaces of the laminate. The wall surfaces of the through holes of the copper clad laminate are subjected to electroless copper plating and copper electroplating, thereby forming the through hole conductors 16 within the respective through holes. Subsequently, the cavities of the through hole conductors 16 are filled with a insulation resin material (epoxy resin), thereby forming the blocking bodies 17.

Figure 4:
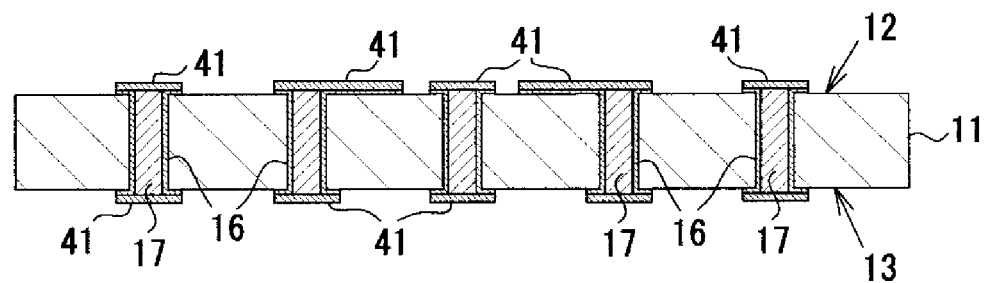
FIG. 4 is an explanatory view showing a method of manufacturing the multilayer wiring substrate.

Furthermore, the surface of the copper clad laminate is subjected to electroless copper plating and copper electroplating to form a copper plating layer on the surface of the copper clad laminate, including exposed portions of the blocking bodies 17. Subsequently, the copper plating layer and copper foil are patterned by, for example, a subtractive process. As a result, as shown in FIG. 4, the core substrate 11 having the conductor layers 41 and the through hole conductors 16 is yielded.

Figure 5:
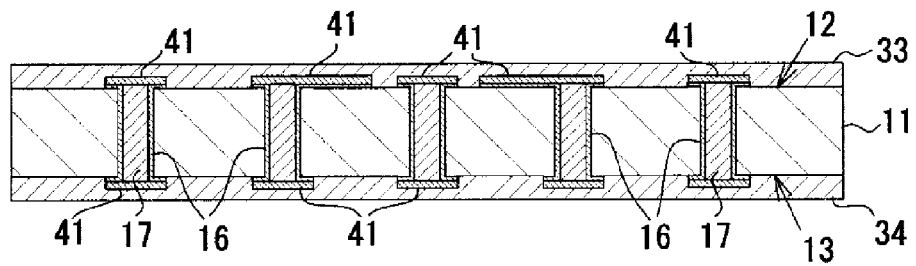
FIG. 5 is an explanatory view showing the method of manufacturing the multilayer wiring substrate.

Then, a buildup step is performed for forming the first buildup layer 31 on the core main surface 12 of the core substrate 11 and for forming the second buildup layer 32 on the core back surface 13. Specifically, as shown in FIG. 5, the sheetlike resin interlayer insulation layers 33 and 34 in which a thermosetting epoxy resin contains a silica filler are affixed to the core main surface 12 and the core back surface 13, respectively, of the core substrate 11, and the resin interlayer insulation layers 33 and 34 are cured (precured) to a certain extent (the interlayer insulation layer forming step).

Figure 6:
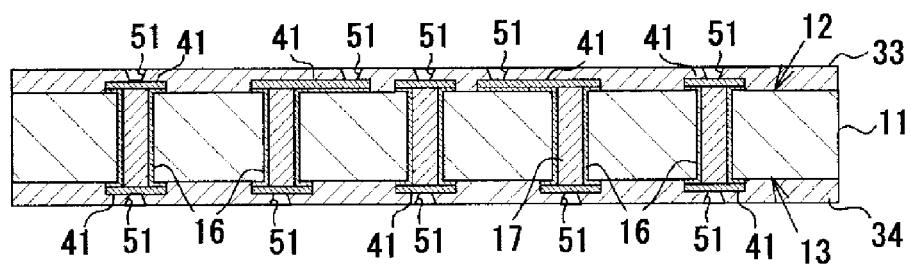
FIG. 6 is an explanatory view showing the method of manufacturing the multilayer wiring substrate.
Figure 7:
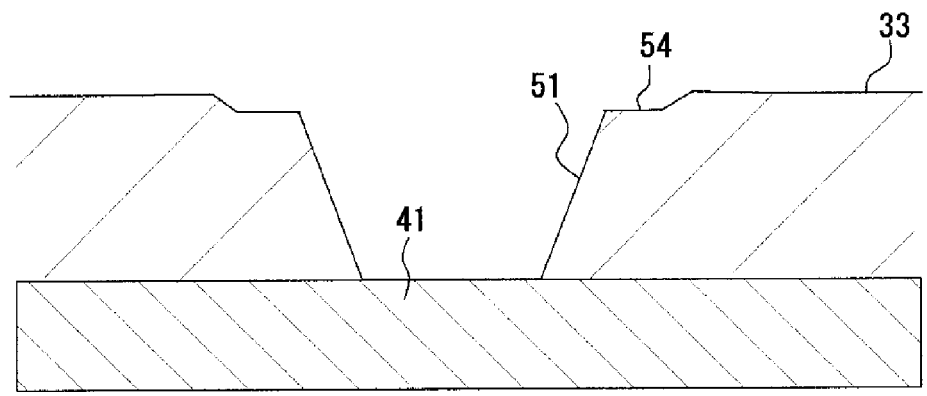
FIG. 7 is an explanatory view showing the method of manufacturing the multilayer wiring substrate.

Then, as shown in FIG. 6, by use of, for example, an excimer laser, a UV laser, or a CO2 laser, laser machining is performed so as to form the via holes 51 in the resin interlayer insulation layers 33 and 34 at predetermined positions (the laser irradiation step). In this step, predetermined via hole formation positions of the resin interlayer insulation layers 33 and 34 are irradiated with a laser beam having a first laser energy, and predetermined stepped portion formation positions of the resin interlayer insulation layers 33 and 34 are irradiated with a laser beam having a second laser energy weaker than the first laser energy. As a result, as shown in FIG. 7, in the resin interlayer insulation layers 33 and 34, the via holes 51 are formed above the conductor layer 41, and recesses 54 are formed in opening verge (edge, rim, margin, or boundary) regions around the via holes 51 in such a manner as to be depressed from their peripheral regions.

Figure 8:
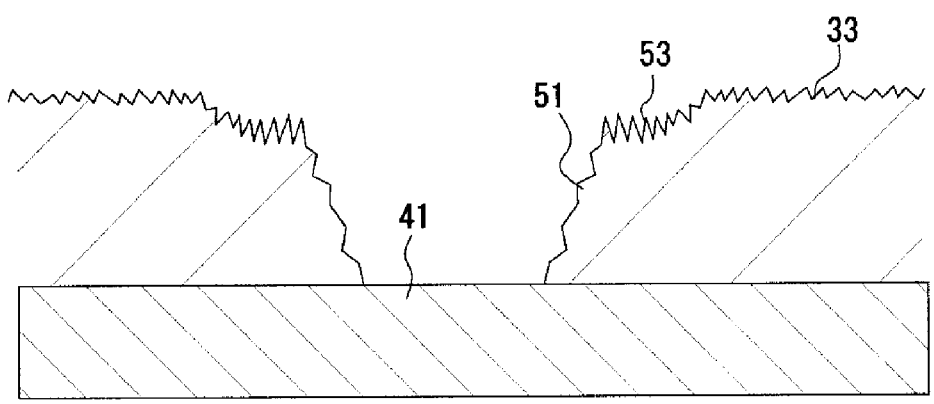
FIG. 8 is an explanatory view showing the method of manufacturing the multilayer wiring substrate.

Next, by use of an etchant, such as potassium permanganate, a desmear step (the roughening step) is performed for removing smear from inside the via holes 51. In the desmear step, other than a process which uses an etchant, a plasma asking process which uses, for example, O2 plasma may be performed. Through execution of the desmear step, as shown in FIG. 8, the surfaces of the resin interlayer insulation layers 33 and 34 are roughened. As a result, the entire surfaces of the resin interlayer insulation layers 33 and 34 become rough surfaces, and the stepped portions 53 are formed at the predetermined stepped portion formation positions; i.e., at the opening verges of the via holes 51; also, the surfaces of the stepped portions 53 become rough surfaces. Since the surfaces of the stepped portions 53 have been damaged to a certain extent by laser irradiation, the stepped portions 53 are higher in surface roughness than their peripheral regions.

Figure 9:
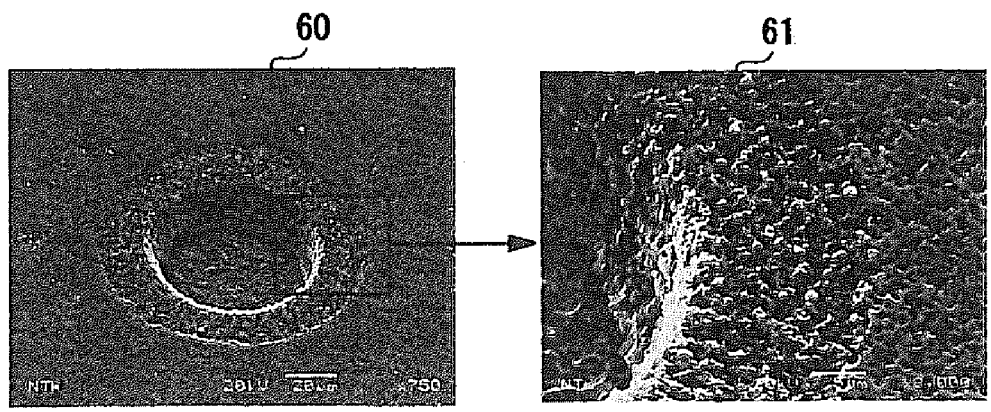
FIG. 9 are SEM photos of a via hole.

FIG. 9 shows an SEM photo 60 of the via hole 51 and its periphery as taken after the desmear process and an SEM photo 61 showing, on an enlarged scale, the stepped portion 53. It has been confirmed from the SEM photos 60 and 61 of FIG. 9 that the annular stepped portion 53 is formed along the verge of opening of the via hole 51 and that the stepped portion 53 is roughened to a higher degree than is its peripheral region.

Figure 10:
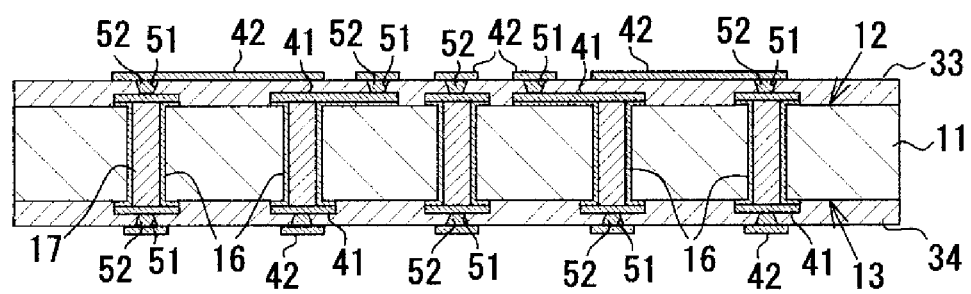
FIG. 10 is an explanatory view showing the method of manufacturing the multilayer wiring substrate.
Figure 11:
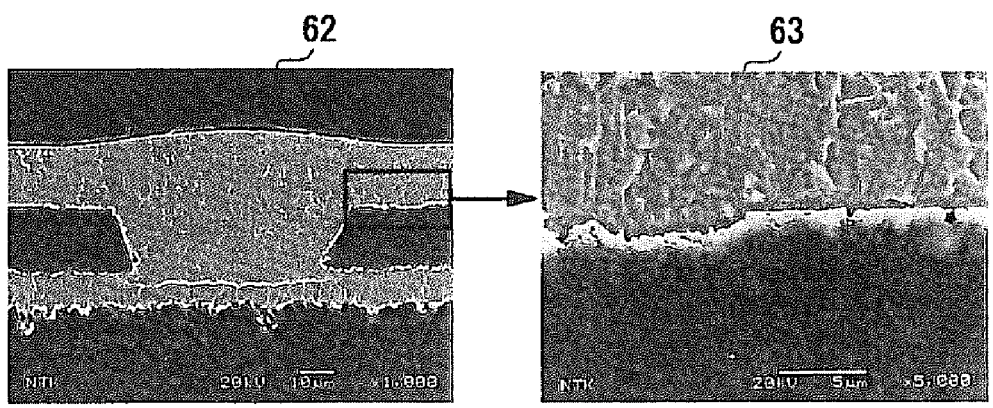
FIG. 11 are SEM photos of a via hole and a via conductor.

After the desmear step, electroless copper plating and copper electroplating are performed by a conventionally known method, thereby forming the via conductors 52 in the respective via holes 51. Furthermore, etching is performed by a conventionally known method (e.g., a semi-additive process), thereby forming the conductor layer 42 in a predetermined pattern on each of the resin interlayer insulation layers 33 and 34 (see FIG. 10). FIG. 11 shows an SEM photo 62 showing a section of the via conductor 52 taken on the axis of the via conductor 52 along the thickness direction of the via conductor 52 and an SEM photo 63 showing, on an enlarged scale, the section. It has also been confirmed from the SEM photos 62 and 63 of FIG. 11 that the stepped portion 53 is formed around the verge of opening of the via hole 51.

Also, the other resin interlayer insulation layers 35 and 36 and the pads 44 and 48 are formed in a manner similar to the above-described manner for formation of the resin interlayer insulation layers 33 and 34 and the conductor layers 42 and are laminated on the resin interlayer insulation layers 33 and 34, respectively. Next, a photosensitive epoxy resin is applied on the resin interlayer insulation layers 35 and 36 and is allowed to set, thereby forming the solder resist layers 37 and 38. Subsequently, the solder resist layers 37 and 38 undergo exposure with respectively predetermined masks placed thereon and then development, thereby forming the openings 40 and 46 in the solder resist layers 38 and 37, respectively, through patterning. Through execution of the above-mentioned steps, the multilayer wiring substrate 10 shown in FIG. 1 is manufactured.

Thus, the present embodiment yields the following effects.

(1) According to the multilayer wiring substrate 10 of the present embodiment, in the resin interlayer insulation layers 33 to 36, the stepped portions 53 are formed in opening verge regions around the via holes 51. By virtue of formation of the stepped portions 53, as compared with the case where no stepped portion is formed in opening verge regions around the via holes 51, concentration of stress on the vicinities of the opening verges of the via holes 51 is avoided, and adhesion can be ensured between the conductor layer 42 and each of the resin interlayer insulation layers 33 to 36. Furthermore, since the stepped portions 53 are higher in surface roughness than their peripheral regions, the bonding strength between the conductor layer 42 and each of the resin interlayer insulation layers 33 to 36 can be enhanced sufficiently at the stepped portions 53. As a result, delamination at connections between the via conductors 52 and the conductor layer 42 can be restrained, whereby the connection reliability of the via conductors 52 can be improved.

(2) In the multilayer wiring substrate 10 of the present embodiment, the conductor layer 42 (lands) connected to upper ends of the via conductors 52 is greater in maximum diameter than the stepped portions 53. By virtue of this feature, in the resin interlayer insulation layers 33 and 34, the surfaces of the stepped portions 53 having high surface roughness are reliably covered with the conductor layer 42 (corresponding lands); thus, patterned wiring lines can be formed at a fine pitch.

(3) In the multilayer wiring substrate 10 of the present embodiment, the via holes 51, the stepped portions 53, and the lands of the conductor layer 42 are disposed concentrically. In this case, the stepped portions 53 can be formed relatively easily around the via holes 51. Also, the conductor layer 42 can be formed in such a manner that bonding strength is uniform along the opening verges of the via holes 51.

(4) In the multilayer wiring substrate 10 of the present embodiment, the resin interlayer insulation layers 33 to 36 are formed by use of a buildup material in which a resin insulation material contains a silica filler in an amount of 60% by weight. In this case, since the resin interlayer insulation layers 33 to 36 contain a silica filler in a greater amount than do conventional resin interlayer insulation layers (having a silica filler content of about 30%), there can be restrained the surface roughnesses of the resin interlayer insulation layers 33 to 36 as measured after the desmear step. As a result, patterned wiring lines of the conductor layer 42 can be formed at a fine pitch on the resin interlayer insulation layers 33 to 36.

Second Embodiment

Figure 12:
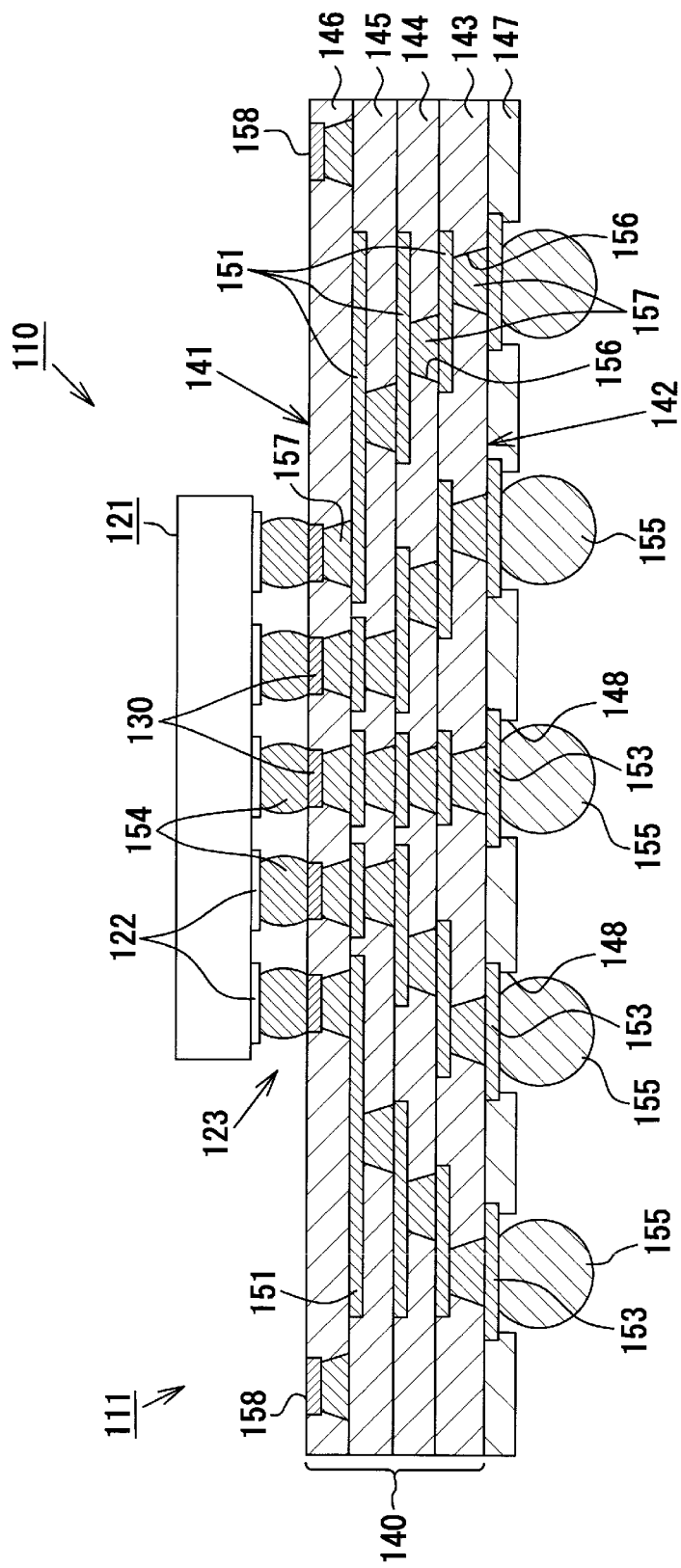
FIG. 12 is a schematic sectional view showing a multilayer wiring substrate according to a second embodiment of the present invention.

The semiconductor package 110 according to a second embodiment of the present invention and a method of manufacturing the same will next be described in detail with reference to the drawings. As shown in FIG. 12, the semiconductor package 110 of the present embodiment is of a BGA (ball grid array) type, and is composed of a multilayer wiring substrate 111 and a IC chip 121 (chip component), which is a semiconductor integrated circuit element. Notably, the type of the semiconductor package 110 is not limited to BGA, and may be PGA (pin grid array), LGA (land grid array), or the like. The IC chip 121 is preferably formed of silicon whose coefficient of thermal expansion is 4.2 ppm/° C. and assumes the form of a rectangular flat plate whose size is 15.0 mm (length)×15.0 mm (width)×0.8 mm (thickness).

Meanwhile, the exemplary multilayer wiring substrate 111 does not have a core substrate, and has a wiring stacked portion 140 (laminated structure) composed of conductor layers 151 formed of copper (interlayer wiring) and four resin insulating layers 143, 144, 145, and 146, which are alternately stacked with the conductor layers 151. The wiring stacked portion 140 of the present embodiment preferably assumes a generally rectangular shape as viewed from above, and has a size of 50.0 mm (length)×50.0 mm (width)×0.4 mm (thickness). In the present embodiment, the coefficient of thermal expansion of the resin insulating layers 143 to 146 is about 10 to 60 ppm/° C. (specifically, about 20 ppm/° C.). Notably, the coefficient of thermal expansion of the resin insulating layers 143 to 146 refers to the average value of measurement values between 30° C. and glass transition temperature (Tg).

Figure 13:
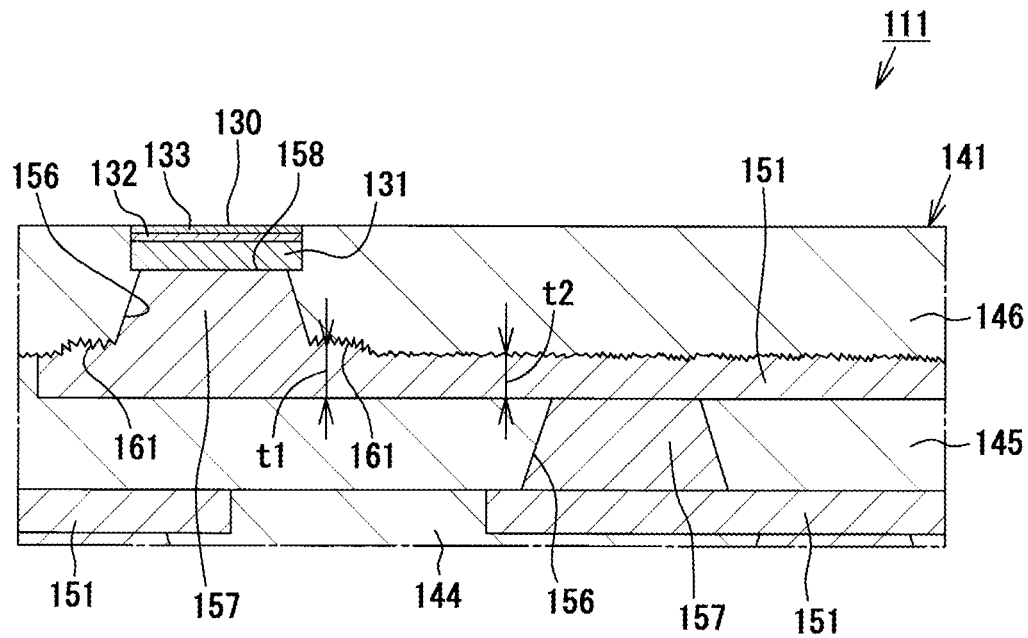
FIG. 13 is a partial schematic sectional view showing a multilayer wiring substrate.

As shown in FIG. 12, a plurality of terminal pads 130 (surface connection terminals) are disposed in an array on a main face 141 of the wiring stacked portion 140 (on the surface of the fourth resin insulating layer 146). As shown in FIG. 13, each of the terminal pads 130 has a laminated structure in which a copper plating layer 131 (copper layer), a nickel plating layer 132 (nickel layer), and a gold plating layer 133 (gold layer) are stacked in this sequence. The thickness of the copper plating layer 131 is set to be not less than 10 μm but less than 20 μm (in the present embodiment, 10 μm). The thickness of the nickel plating layer 132 is set to be not less than 3 μm but less than 10 μm (in the present embodiment, 5 μm). The thickness of the gold plating layer 133 is set to be not less than 0.1 μm but less than 3 μm (in the present embodiment, 0.5 μm).

A plurality of solder bumps 154 are disposed on the surfaces of the terminal pads 130. Terminals 122 of the IC chip 121 are surface-connected to the solder bumps 154. The IC chip 121 is mounted on the main face 141 of the wiring stacked portion 140. Notably, a region where the terminal pads 130 and the solder bumps 154 are formed is an IC-chip mounting region 123 in which the IC chip 121 can be mounted.

Meanwhile, as shown in FIG. 12, a plurality of pads 153 for BGA are disposed in an array on the back face 142 of the wiring stacked portion 140 (on the lower surface of the first resin insulating layer 143). The pads 153 for BGA have a layered structure in which a nickel plating layer and a gold plating layer are stacked on a copper terminal in this sequence. Further, substantially the entirety of the lower surface of the resin insulating layer 143 is covered with a solder resist layer 147. Opening portions 148 for exposing the pads 153 for BGA are formed in the solder resist layer 147 at predetermined positions thereof. A plurality of solder bumps 155 for motherboard connection are disposed on the surfaces of the pads 153 for BGA, and the wiring stacked portion 140 is mounted on an unillustrated motherboard via the solder bumps 155.

As shown in FIGS. 12 and 13, each of the resin insulating layers 143 to 146 has via holes 156 and via conductors 157 formed therein. The via holes 156, each assuming the form of a truncated cone, are formed through drilling performed for each of the resin insulating layers 143 to 146 by use of a YAG laser or carbon dioxide gas laser. The via conductors 157 are conductors whose diameter increases toward the back face 142 of the wiring stacked portion 140 (downward in FIGS. 1 and 2), and establish electrical connection among the conductor layers 151, the terminal pads 130, and the pads 153 for BGA. The terminal pads 130 are connected to the smaller-diameter-side end faces 158 of the via conductors 157 (see FIG. 13). The larger-diameter-side end faces 158 of the conductors 157 are connected to the conductor layers 151 (interlayer wiring).

As shown in FIG. 13, stepped portions 161 are formed in respective opening verge regions of the surface of the interlayer insulation layer 146 around the via holes 156 such that the stepped portions are depressed from peripheral regions around the opening verge regions and the stepped portions 161 are higher in surface roughness than the peripheral regions. FIG. 2, shows the via hole 156 and the via conductor 157 formed in the resin interlayer insulation layer 146, and the via conductor 157 connects the conductor layer 151 on the lower side (the lower conductor layer) and the conductor layer 130 on the upper side (the upper conductor layer). In addition, it described above that the terminal pads 130 are pads for connecting with IC chip 121 through the solder bumps 154.

The interlayer wiring 151 is formed on the stepped portions 161 and the peripheral regions, and other via conductors 157 are connected to portions of the interlayer wiring 151 formed on the peripheral regions. Preferably, the thickness (t1) of portions of the interlayer wiring 151 formed on the stepped portions 161 of the interlayer insulation layer 146 are greater than that (t2) of portions of the interlayer wiring 151 formed on the peripheral regions of the interlayer insulation layer 146. The interlayer wiring 151 includes the land connected to the lower end part of via conductors 157. In the present embodiment, the maximum diameter of the interlayer wiring 151 (land) connected to the lower end of the via conductor 157 is greater than that of the stepped portion 161. That is, the stepped portion 161 covered completely with the interlayer wiring 151.

Next, a method for manufacturing the semiconductor package 110 will be described. The present embodiment employs a method in which a support substrate (glass epoxy substrate or the like) having sufficient strength is prepared, and the conductor layers 151 and the resin insulating layers 143 to 146 of the multilayer wiring substrate 111 (the wiring stacked portion 140) are built up on the support substrate.

Specifically, a laminated metal sheet (that is, a support layer) is disposed on each of opposite faces of the support substrate. Each of the laminated metal sheets is composed of two copper foil layers and separably bonded together. Specifically, each laminated metal sheet is formed by laminating the copper foil layers and with metal plating (e.g., chromium plating) interposed therebetween. A surface of each of the copper foil layers which surface does not face the opposite copper foil layer is roughened so that fine pits and projections are present thereon.

In a subsequent terminal forming step, a dry film (thickness: about 15 μm), which serves as a resist (mask), is laminated on each of the laminated metal sheets. Next, through performance of exposure and development, openings (diameter: 100 μm) are formed in the dry film at predetermined positions thereof so as to expose portions of the surface of the copper foil layer. Subsequently, a gold plating layer 133, a nickel plating layer 132, and a copper plating layer 131 are stacked in this sequence on portions of the copper foil layer exposed from the openings, whereby the terminal pads 130 are formed. More specifically, electro gold plating is first performed so as to form a gold plating layer 133 having a predetermined thickness. Further, electro copper plating is performed such that a copper plating layer 131 having a predetermined thickness is formed on the nickel plating layer 132. Thus, the terminal pads 130 are completed. After that, the dry film is removed.

In a subsequent resin-insulating-layer forming step, sheet-like insulating resin base materials are stacked on both the laminated metal sheets; pressure and heat are applied to the resultant laminate under vacuum by use of a vacuum-bonding hot press machine; and the laminate is cured, whereby the fourth resin insulating layers 146, which cover the terminal pads 130, are formed. Subsequently, through laser machining, the via holes 156 are formed in the resin insulating layers 146 at predetermined positions thereof, and a conventionally known desmearing process is performed so as to remove smears within the via holes 156. In this step, predetermined via hole formation positions of the resin interlayer insulation layers 146 are irradiated with a laser beam having a first laser energy, and predetermined stepped portion formation positions of the resin interlayer insulation layers 146 are irradiated with a laser beam having a second laser energy weaker than the first laser energy. As a result, as shown in FIG. 13, recesses 161 are formed in opening verge regions around the via holes 156 in such a manner as to be depressed from their peripheral regions.

In a subsequent conductor forming step, electroless copper plating and electro copper plating are performed in accordance with a conventionally known method, whereby the via conductors 157 are formed within the via holes 156. At that time, the smaller-diameter-side end faces 158 of the via conductors 157 formed in the resin insulating layers 146 are connected to the terminal pads 130. Further, through performance of etching in accordance with a conventionally known method (e.g., semiadditive method), a conductor layer 151 of a predetermined pattern is formed on each of the resin insulating layers 146.

The first through third resin insulating layers 143 to 145 and the remaining conductor layers 151 are formed by the same method as the method employed for formation of the above-described fourth resin insulating layers 146 and the above-mentioned conductor layers 151, and are stacked on the resin insulating layers 146. Subsequently, a photosensitive epoxy resin is applied onto each resin insulating layer 143 having the pads 153 for BGA, and is cured, whereby a solder resist layer 147 is formed. Next, opening portions 148 are formed in the solder resist layer 147 through performance of exposure and development with a mask having a predetermined pattern disposed on the solder resist layer 147. As a result of performance of the above-described manufacturing steps, there is formed a laminate in which the laminated metal sheet, the resin insulating layers 143 to 146, and the conductor layers 151 are stacked on each of opposite sides of the support substrate. A portion of the laminate located on each laminated metal sheet serves as a wiring stacked portion 140.

Subsequently, the laminate is cut by use of a dicing machine (not shown) so as to remove a portion of the laminate around the wiring stacked portions 140. At that time, the wiring stacked portions 140 are cut together with the support substrate at the boundary between the wiring stacked portions 140 and a peripheral portion around the wiring stacked portions 140. As a result of this cutting, outer edge portions of the laminated metal sheet buried in the resin insulating layers 146 are exposed to the outside. That is, through removal of the peripheral portion, the area where the support substrate and the resin insulating layers are bonded together is lost. As a result, there is created a state in which the wiring stacked portions 140 are connected to the support substrate only through the laminated metal sheets.

In a subsequent support layer removing step, the laminate is first separated into the wiring stacked portions 140 and the support substrate, whereby the copper foil layers are exposed. Specifically, the two copper foil layers of each laminated metal sheet are separated from each other at the boundary therebetween so as to separate the wiring stacked portions 140 from the support substrate. Further, etching is performed on the copper foil layer on the main face 141 of each wiring stacked portion 140 (the resin insulating layer 146) so as to remove the copper foil layer and expose the gold layers 133 of the terminal pads 130, etc. from the main face 141. In a subsequent solder-bump forming step, the solder bumps 154 for IC chip connection are formed on the plurality of terminal pads 130 formed on the outermost resin insulating layer 146 of the multilayer wiring substrate 111.

After that, the IC chip 121 is mounted on the wiring stacked portion 140 to be located within the IC-chip mounting region 123. At that time, the terminals 122 of the IC chip 121 are aligned with the solder bump 154 on the wiring stacked portion 140. Subsequently, the solder bumps 154 are heated for reflow. As a result, the terminals 122 are joined to the solder bumps 154, and the IC chip 121 is mounted on the wiring stacked portion 140, whereby the semiconductor package 110 of FIG. 12 is completed.

The embodiment of the present invention may be modified as follows.

Figure 14:
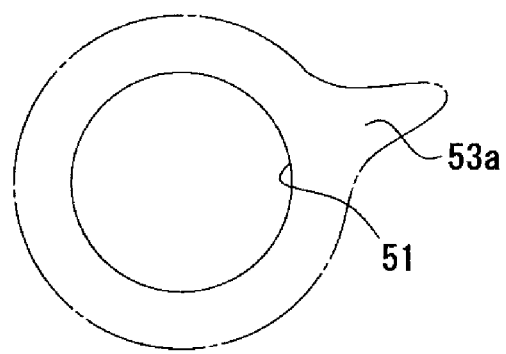
FIG. 14 is a plan view showing a via hole and a stepped portion according to another embodiment of the present invention.
Figure 15:
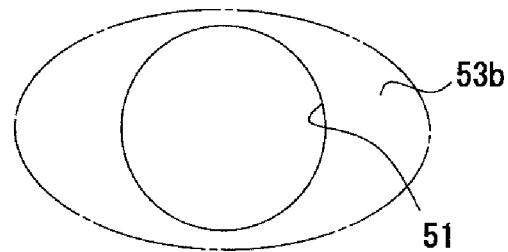
FIG. 15 is a plan view showing a via hole and a stepped portion according to a further embodiment of the present invention.
Figure 16:
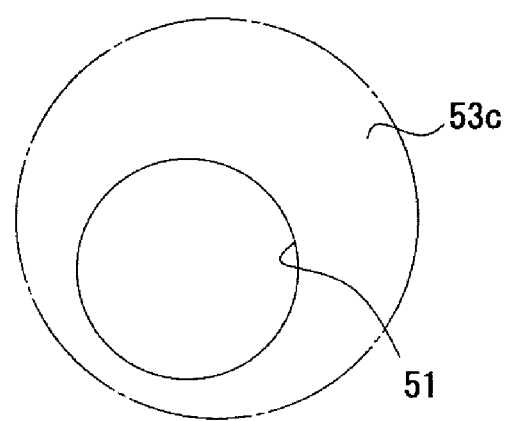
FIG. 16 is a plan view showing a via hole and a stepped portion according to a still further embodiment of the present invention.
Figure 17:
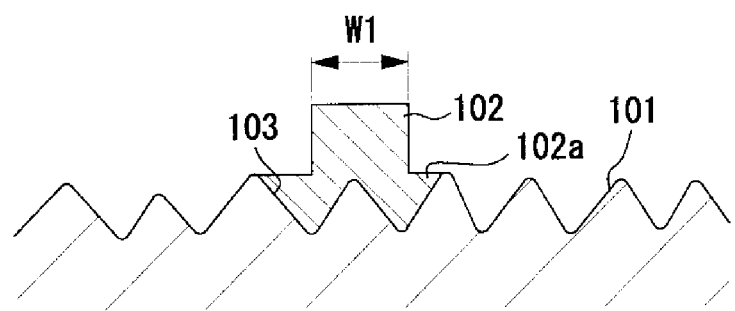
FIG. 17 is an explanatory view showing a patterned wiring line on an interlayer insulation layer of a conventional multilayer wiring substrate.

In the multilayer wiring substrate 10 of the above-described embodiment, the stepped portions 53 are formed concentrically to the via holes 51. However, the present invention is not limited thereto. FIGS. 14 to 16 show modified stepped portions 53a to 53c. The stepped portion 53a of FIG. 14 has a circular shape whose portion projects radially outward. The stepped portion 53b of FIG. 15 has an elliptical shape. Furthermore, the stepped portion 53c of FIG. 16 is shaped eccentrically to the via hole 51. The shapes of the stepped portions 53a to 53c can be modified as appropriate according to, for example, the positions of connections between the via conductors 52 and patterned wiring lines of the conductor layer 42. By virtue of this, delamination at the via conductors 52 can be reliably restrained.

According to the above-described embodiment, in the laser irradiation step, the predetermined via hole formation positions of the resin interlayer insulation layers 33 to 36 are irradiated with a laser beam having a first laser energy, and the predetermined stepped portion formation positions of the resin interlayer insulation layers 33 to 36 are irradiated with a laser beam having a second laser energy weaker than the first laser energy. However, the present invention is not limited thereto. For example, the predetermined via hole formation positions and the predetermined stepped portion formation positions may be irradiated with laser beams at different timings for forming the via holes 51 in the resin interlayer insulation layers 33 to 36 and for forming the stepped portions 53.

Next, technical ideas that the above-described embodiment implements are enumerated below.

(1) A multilayer wiring substrate according to any one of means 1 to 2, wherein the via conductors are filled vias.

(2) A multilayer wiring substrate according to any one of means 1 to 2, wherein the via conductors are copper plating.

(3) A multilayer wiring substrate according to any one of means 1 to 2, wherein the interlayer insulation layers are formed by use of a buildup material made of a thermosetting resin.

(4) A method of manufacturing a multilayer wiring substrate according to means 3, wherein the roughening step is a desmear step.

DESCRIPTION OF REFERENCE NUMERALS 10, 111: multilayer wiring substrate
33 to 36, 143 to 146: resin interlayer insulation layer
41, 156: lower conductor layer (interlayer wiring)
42: upper conductor layer
51: via hole
52: via conductor
53, 53a to 53c, 161: stepped portion
130: terminal pad which serves as upper conductor layer
t1: thickness of portions of the interlayer wiring formed on the stepped portions of the interlayer insulation layer
t2: thickness of portions of the interlayer wiring formed on the peripheral regions of the interlayer insulation layer

What is claimed is:

1. A multilayer wiring substrate comprising:
an interlayer insulation layer isolating a lower conductor layer from an upper conductor layer;
via holes formed in the interlayer insulation layer; and
via conductors formed in the respective via holes for connecting the lower conductor layer and the upper conductor layer;
wherein:
the via holes open at a surface of the interlayer insulation layer;
stepped portions are formed in opening verge regions of the surface around the via holes such that the stepped portions are recessed from peripheral regions of the interlayer insulation layer around the opening verge regions;
the surface of the interlayer insulation layer, which includes the stepped portions and the peripheral regions, is a rough surface;
the stepped portions are higher in surface roughness than the peripheral regions;
the upper conductor layer comprises lands connected to upper ends of the corresponding via conductors continuously; and
the via conductors and the upper conductor layers cover a top surface of the stepped portions and a top surface of the peripheral regions.

2. A multilayer wiring substrate according to claim 1, wherein maximum diameters of the lands are greater than those of the corresponding stepped portions.

3. A multilayer wiring substrate according to claim 1, wherein the via holes, the stepped portions, and the lands are disposed concentrically.

4. A multilayer wiring substrate according to claim 1, wherein the stepped portions have a depth of 1 μm to 3 μm inclusive and a surface roughness of less than 1 μm.

5. A multilayer wiring substrate according to claim 1, wherein the stepped portions have a width of 10 μm to 30 μm inclusive.

6. A multilayer wiring substrate according to claim 1, wherein the interlayer insulation layer is formed of an insulation resin material containing an inorganic filler in an amount of 50% by weight or greater.

7. A multilayer wiring substrate according to claim 1, wherein a thickness of portions of the upper conductor layer formed on the stepped portions of the interlayer insulation layer is greater than a thickness of portions of the upper conductor layer formed on the peripheral regions of the interlayer insulation layer.

8. A multilayer wiring substrate according to claim 1, wherein the interlayer insulation layer is a single layer.

9. A multilayer wiring substrate comprising:
an interlayer insulation layer;
via conductors charged into via holes formed in the interlayer insulation layer;
terminal pads embedded in a terminal pad side of the interlayer insulation layer; and
an interlayer wiring formed on a surface of an interlayer wiring side of the interlayer insulation layer that is opposite the terminal pad side, the interlayer wiring being connected to the terminal pads via the via conductors;
wherein:
the via holes are shaped such that their diameters increase from the terminal pad side toward the interlayer wiring side;
stepped portions are formed in respective opening verge regions of the surface of the interlayer insulation layer around the via holes such that the stepped portions are recessed from peripheral regions of the surface of the interlayer insulation layer around the opening verge regions;
the stepped portions and the peripheral regions include a rough surface, and the stepped portions are higher in surface roughness than the peripheral regions;
the interlayer wiring includes lands connected to upper ends of the via conductors continuously; and
the lands cover a top surface of the stepped portion and a top surface of the peripheral regions.

10. A multilayer wiring substrate according to claim 9, wherein:
the interlayer wiring is formed on the stepped portions and the peripheral regions; and
other via conductors are connected to portions of the interlayer wiring formed on the peripheral regions.

11. A multilayer wiring substrate according to claim 9, wherein a thickness of portions of the interlayer wiring formed on the stepped portions of the interlayer insulation layer is greater than a thickness of portions of the interlayer wiring formed on the peripheral regions of the interlayer insulation layer.

12. A multilayer wiring substrate according to claim 9, wherein maximum diameters of the lands are greater than those of the corresponding stepped portions.

13. A multilayer wiring substrate according to claim 9, wherein the terminal pads are connected to a semiconductor chip via solder bumps.

14. A multilayer wiring substrate according to claim 9, wherein the interlayer insulation layer is a single layer.

15. A method of manufacturing a multilayer wiring substrate, comprising:
an interlayer insulation layer forming step of forming an interlayer insulation layer which covers a lower conductor layer;
a laser irradiation step of irradiating predetermined via hole formation positions of the interlayer insulation layer with a laser beam having a first laser energy to form via holes in the interlayer insulation layer, and irradiating predetermined stepped portion formation positions of the interlayer insulation layer in opening verge regions of a surface of the interlayer insulation layer around the via holes with a laser beam having a second laser energy weaker than the first laser energy such that the stepped portion are recessed from peripheral regions of the interlayer insulation layer around the opening verge regions; and
a roughening step of roughening, after the laser irradiation step, the interlayer insulation layer so as to make an entire surface of the interlayer insulation layer, including the stepped portions and the peripheral regions, a rough surface such that surfaces of the stepped portions are higher in surface roughness than the peripheral regions;
a via conductor forming step of forming, after the roughening step, via conductors in the respective via holes for connecting the lower conductor layer and an upper conductor layer, the via holes opening at the rough surface of the interlayer insulation layer; and
an upper conductor layer forming step of forming, after the via conductor forming step, the upper conductor layer that includes lands connected to upper ends of the corresponding via conductors continuously, wherein
the via conductors and the upper conductor layers cover a top surface of the stepped portions and a top surface of the peripheral regions.

\* \* \* \* \*